United States Patent [19]
Laskaris et al.

[11] Patent Number: 5,225,782
[45] Date of Patent: Jul. 6, 1993

[54] EDDY CURRENT FREE MRI MAGNET WITH INTEGRATED GRADIENT COILS

[75] Inventors: Evangelos T. Laskaris; Peter B. Roemer, both of Schenectady; Bizhan Dorri, Clifton Park; Mark E. Vermilyea, Schenectady, all of N.Y.

[73] Assignee: General Electric Company, Schenectady, N.Y.

[21] Appl. No.: 759,389

[22] Filed: Sep. 13, 1991

[51] Int. Cl.⁵ .............................................. G01V 3/00
[52] U.S. Cl. ...................................... 324/318; 324/319
[58] Field of Search ...................... 324/318, 319, 320; 335/216, 296, 297, 300

[56] References Cited

U.S. PATENT DOCUMENTS

| | | | |
|---|---|---|---|
| 4,646,024 | 2/1987 | Schenck et al. | 324/318 |
| 4,652,824 | 3/1987 | Oppelt | 324/319 |
| 4,737,716 | 4/1988 | Roemer et al. | 324/319 |
| 4,876,510 | 10/1989 | Siebold et al. | 324/318 |
| 4,924,184 | 5/1990 | Yoda | 324/318 |
| 4,924,198 | 5/1990 | Laskaris | 335/216 |
| 4,931,759 | 6/1990 | Breneman et al. | 324/320 |
| 5,101,638 | 4/1992 | White | 324/318 |

Primary Examiner—Louis Arana
Attorney, Agent, or Firm—James R. McDaniel; Paul R. Webb, II

[57] ABSTRACT

This invention relates to refrigerated superconducting eddy current free MR magnets having integrated gradient coils. In particular, the amount of resultant eddy currents produced by the magnet are substantially reduced while reducing the size and weight, and, therefore, the cost of the superconducting magnet required to produce an acceptable MR image.

16 Claims, 3 Drawing Sheets

EDDY CURRENT FREE MRI MAGNET WITH INTEGRATED GRADIENT COILS

CROSS REFERENCE TO RELATED APPLICATIONS

This application is related to commonly assigned U.S. patent application Ser. Nos. 07/759,337 and 07/759,387, entitled "Refrigerated Superconducting MR Magnet with Integrated Gradient Coils" and "Refrigerated Superconducting MR Magnet With Integrated Cryogenic Gradient Coils", respectively.

BACKGROUND OF THE INVENTION

1. Field of the Invention

This invention relates to eddy current free superconducting MR magnets having integrated gradient coils. Such structures of this type generally reduce the size and weight and therefore, the cost of the superconducting magnet required for an MR imaging system while substantially eliminating the resultant eddy currents in the magnet.

2. Description of the Related Art

Present superconducting MR magnets employ windings which operate in liquid helium to maintain the temperature at approximately 4 K. The liquid helium pool requires a vessel which is vacuum tight and which meets ASME pressure vessel requirements; such a vessel is typically made of welded aluminum alloy cylinders and flanges. Thermal radiation shields, of which two are typically used, are also made of welded aluminum pieces and contain the helium vessel. When the gradient coils in the bore of the magnet are electrically pulsed, the resulting time changing magnetic flux in any of the electrically conducting cylinders sets up eddy currents which, in turn, produce other magnetic fields which degrade the quality of the desired gradient field in space and time. This behavior makes it attractive for the aggressive pulse sequences which are routinely used in MR imaging today to use a second set of gradient coils in the magnet bore. This shield gradient coil sets up fields which counteract those of the main gradient coil outside of the shield coil, thus greatly reducing any mutual inductance with conducting members such as the thermal shields and minimizing the resultant eddy currents.

The use of such shield gradient coils increases the radial thickness of the gradient coil set relative to a simple single coil set because of the required gap between them and dictates the size, and thus weight and cost, of the magnet, which must lie radially outside of the shield gradient. Therefore, a more advantageous system would be realized if the magnet could be made to have no mutual coupling to the gradient coil set and the magnet could be placed in much closer proximity to the gradients without having any deleterious eddy currents induced in it. The resulting system could be dramatically smaller and less expensive than existing ones.

It is apparent from the above that there exists a need in the art for a superconducting MR magnet which is reduced in size, weight and cost through simplicity of parts and uniqueness of structure, and which at least equals the imaging characteristics of known superconducting magnets, but which at the same time substantially reduces the amounts of resultant eddy currents produced in the magnet by the gradient coils. It is a purpose of this invention to fulfill this and other needs in the art in a manner more apparent to the skilled artisan once given the following disclosure.

SUMMARY OF THE INVENTION

Generally speaking, this invention fulfills these needs by providing a MR magnet which is substantially eddy current free, comprising a first shell means, a first shield means located at a predetermined distance away from said shell means, a magnet cartridge means having a coil form means and superconducting coils wound on said coil form means and located substantially adjacent to said first shield means, a support means, at least one gradient coil means located at a predetermined distance away from said first shield means, RF shield means rigidly attached to said gradient coil means, RF coil means located at a predetermined distance away from said RF shield means, and an enclosure means which encloses said first shell means, said first shield means, said magnet cartridge means, said support means, said gradient coil means and said RF shield means.

In certain preferred embodiments, the first shield means is a thermal shield having inner and outer fiberglass shells connected by fiberglass end plates and including segmented, electrically insulated strips of copper, aluminum or other materials with high thermal conductivity. Also, the support means includes axial straps and radial thin wall tubes which support the magnet cartridge and thermal shield, respectively. The enclosure means includes a magnetic shield comprised of a axially segmented cylindrical shell, a fiberglass shell, spacers and end plates. Finally, the magnet cartridge means is layered with segmented copper strips to provide axial heat conduction and to assist in reducing eddy currents.

In another further preferred embodiment, the size and weight and, ultimately, the cost of the MR imaging system is reduced when the superconducting magnet of the present invention is employed while substantially eliminating the eddy currents induced in the magnet.

The preferred superconducting MR magnet, according to this invention, offers the following features: lightness in weight; good superconducting characteristics; good MR imaging characteristics; good stability; substantially reduced resultant eddy currents; good durability; improved economy; and high strength for safety. In fact, in many of the preferred embodiments, these factors of weight, eddy currents and economy are optimized to an extent considerably higher than heretofore achieved in prior, known superconducting MR magnets.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which.

DETAILED DESCRIPTION OF THE INVENTION

Figure 1:
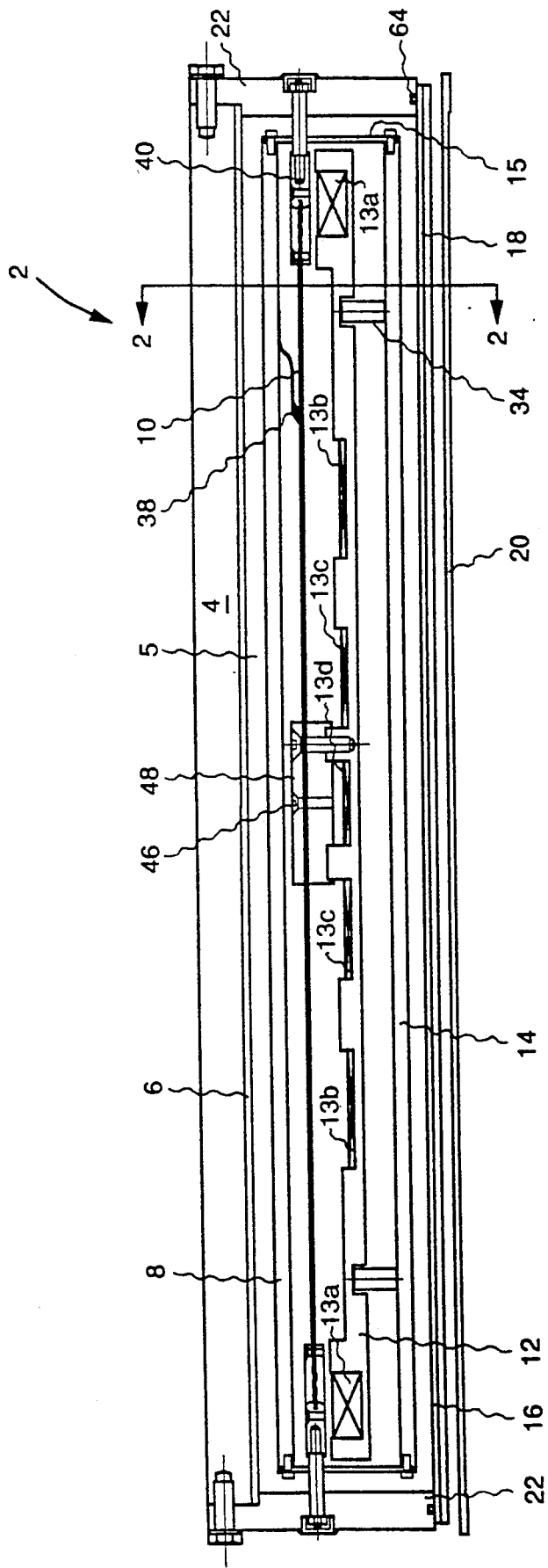
FIG. 1 is a side plan view of an eddy current free MR magnet, according to the present invention.

With reference first to FIG. 1, there is illustrated a substantially eddy current free MRI magnet 2. Included as part of magent 2 are magnetic shield 4 and shell 6. Shield 4, preferably, is constructed of any suitable ferromagnetic and impermeable material such as iron or carbon steel while shell 6, preferably, is constructed of fiberglass material. Outer shell 8, inner shell 14 and end plates 15 comprise the thermal shield for conventional magnet cartridge 12 and conventional superconducting coils 13a-13d. Shells 8, 14 and end plates 15 are rigidly connected by conventional fasteners 50 (FIG. 3) for rigidity and good thermal conduction. Coils 13a-13d, preferably, are wound with $Nb_3Sn$ tape in circular grooves (not shown) on coil form 11. Cartridge 12 is substantially constructed the same as winding 13 as set forth in U.S. Pat. No. 4,924,198 to E. T. Laskaris, entitled "Superconductive Magnetic Resonance Magnet Without Cryogens" and assigned to the same assignee as the present invention.

Axial straps 44 (FIG. 2), preferably, constructed of copper are bonded by conventional bonding techniques to the inside bore of magnet cartridge 12 to enhance axial thermal conduction. In particular, straps 44 overlap each other circumferentially and are electrically insulated from each other, preferably, with a coating of film insulation 45 such as Mylar polycarbonate film either applied directly to each strap or inserted at the overlapping interface between each strap 44. Shells 8, 14 and end plates 15, preferably, are constructed of fiberglass composite. In order to eliminate eddy currents induced from the pulsation of gradient coils 16, electrically conducting structure of shells 8, 14 and end plates 15 are electrically segmented in the axial direction. In particular, overlapping axial straps 36 (FIG. 2) of copper, aluminum or any other high thermal conductivity material are bonded by conventional bonding techniques on the surface of shells 8,14 and end plates 15 and electrically insulated from one another by insulation 35, preferably, Mylar film to provide good axial and circumferential thermal conduction. Insulation 35 is either applied directly to each strap 36 or inserted at the overlapping interface between each strap 36.

Figure 3:
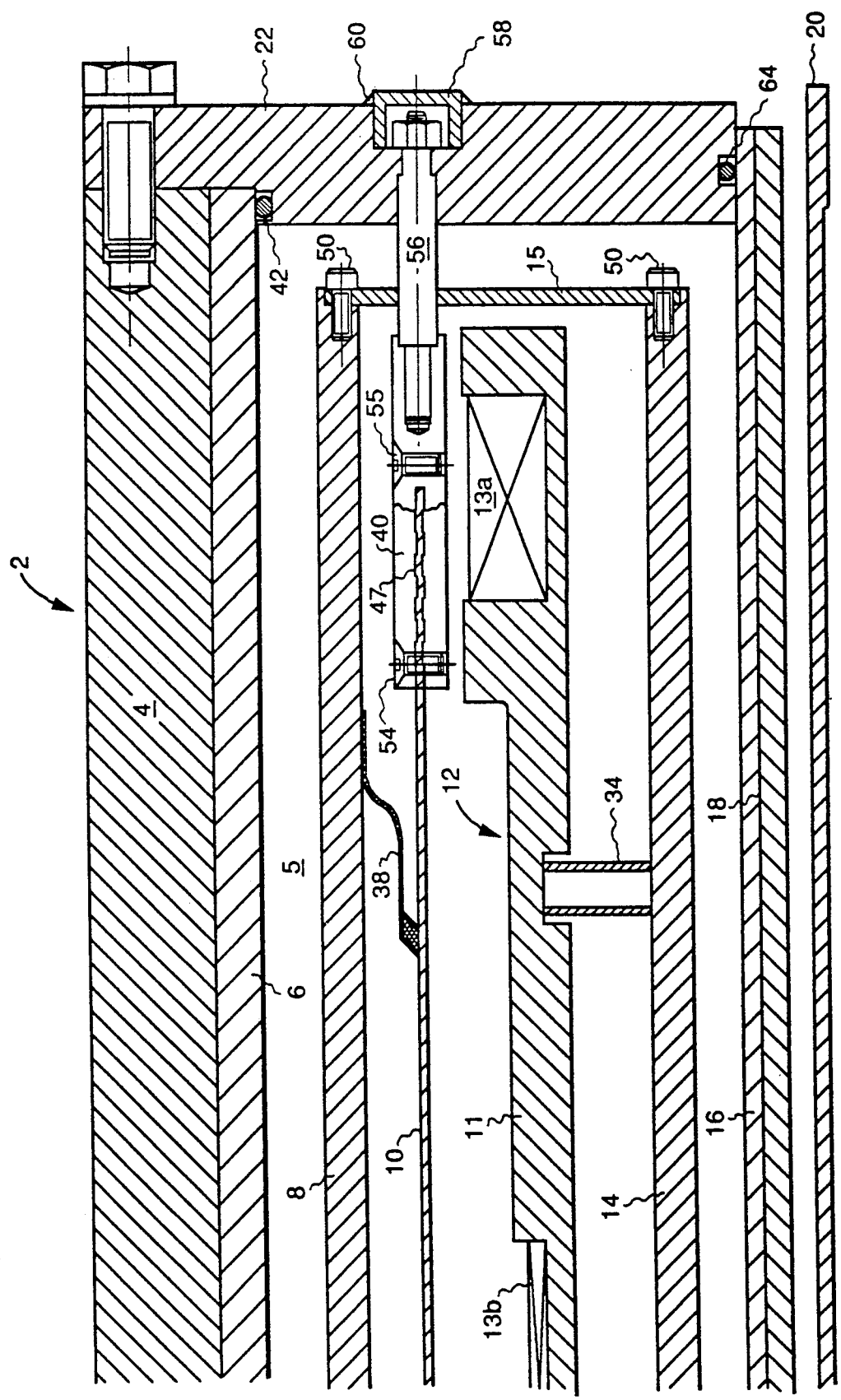
FIG. 3 is a detailed, side plan view showing how the magnetic shield, the shells, the RF shield, the RF coil, the gradient coils and the mechanical supports are attached to the enclosure, according to the present invention.

Now referring to FIG. 3, magnet cartridge 12 is suspended within magnet 2 by axial straps 10 and mechanical support 46. Straps 10, preferably, are fiberglass and number at least four. A minimum of four axial straps 10 is required to provide support of magnet cartridge 12 against vertical as well as horizontal inertia forces. Straps 10, preferably, are positioned such that they are located at approximately 90° from each other around the circumference of magnet cartridge 12. Straps 10, preferably, are pretensioned by clamp 40 during assembly and as a result of cooldown from ambient (300° K.) to cryogenic temperatures (10 K. to 40 K.). Cooldown of magnet 2 results in no forces from the suspension because magnet cartridge 12 is suspended from the middle of each strap 10. Straps 10 are also heat stationed to shell 8 by braids 38 to minimize the heat transfer to magnet cartridge 12. Braids 38, preferably, are constructed of copper and are connected to shell 8 and strap 10 by conventional connectors. Magnet cartridge 12 is rigidly attached to strap 10 by mechanical support 48 and a conventional fastener 46 (FIG. 1). Support 48, preferably, is constructed of non-magnetic stainless steel. Shells 8,14 and end plates 15 are suspended directly from magnet cartridge 12 by radial fiber reinforced thin wall tubes 34. Tubes 34, preferably, are constructed of carbon graphite or equivalent high strength fiber material.

As shown in FIG. 3, strap 10 is rigidly held within clamp 40 which, in turn, is held together with conventional fasteners 54 and 55. Clamp 40, preferably, is constructed of stainless steel and contains grooves 47 which mate with matching grooves in strap 10 so that strap 10 remains stationary within clamp 40. The grooves in strap 10 and clamp 40 are constructed by conventional machining techniques. Clamp 40 passes through a hole in end plates 15 and is rigidly attached to end plate 22 by a conventional close tolerance fastener 56. A cap 58 is placed over end plate 22 at the place where fastener 56 with end plate 22 and a vacuum tight weldment 60 is placed around cap 58 to provide a vacuum seal between cap 58 and end plate 22. Cap 58 and weldment 60 are used to substantially eliminate any leakage from the atmosphere to cavity 5 along fastener 56.

Located below inner shell 14 are gradient coils 16. Gradient coils 16, preferably, are constructed the same as those set forth in U.S. Pat. No. 4,737,716 to Roemer et al., entitled "Self-Shielded Gradient Coils For Nuclear Magnetic Resonance Imaging" and assigned to the same assignee as the present invention. Coils 16 along with elastomeric O-ring seal 64 is used to form a vacuum tight fiberglass composite shell that is used as the bore vacuum envelope of the magnetic cyrostat. A conventional RF shield 18 is bonded by conventional bonding techniques to coils 16. A conventional RF coil 20 is positioned adjacent to RF shield 18 by conventional positioners.

Figure 2:
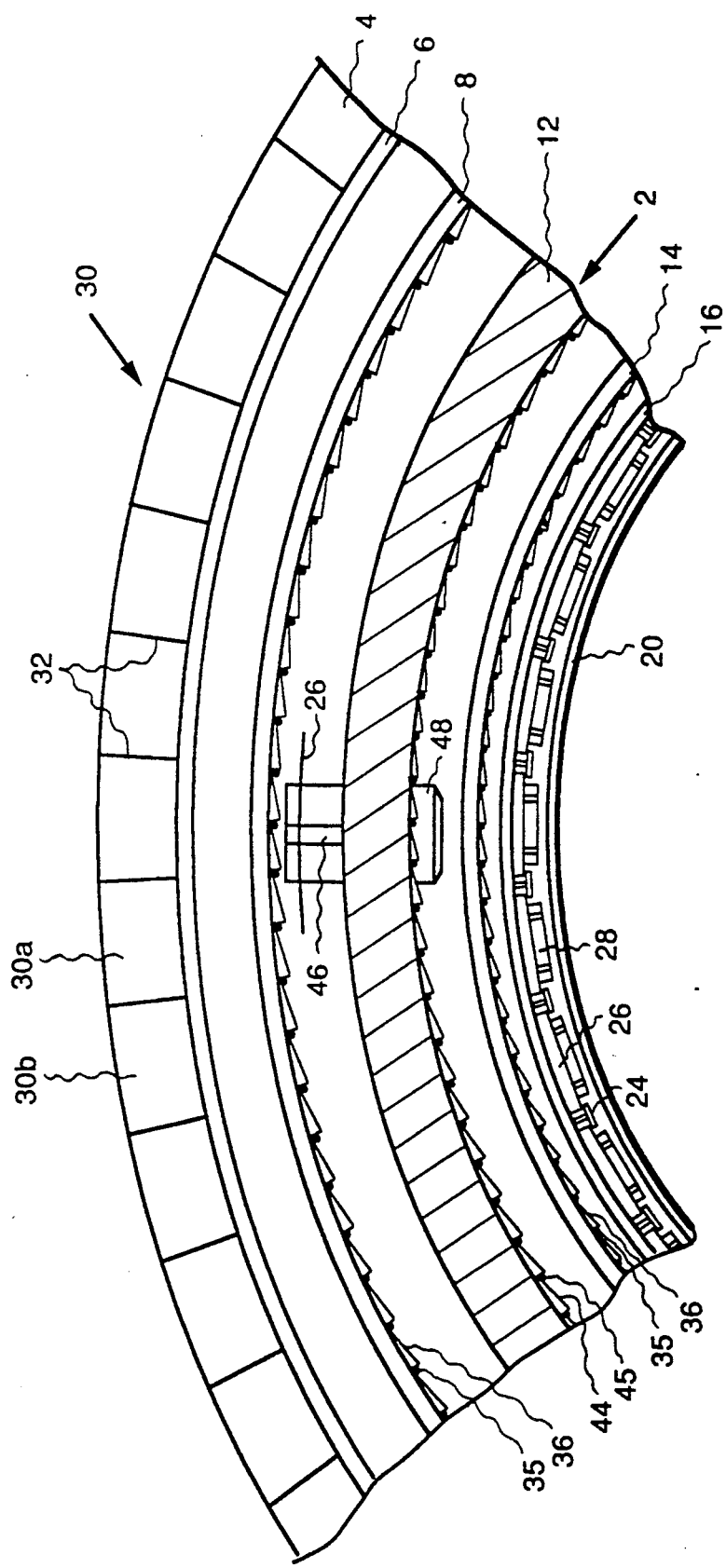
FIG. 2 is an end view of an eddy current free MR magnet, taken along line 2—2 in FIG. 1, according to the present invention.

FIG. 2 illustrates an end view of the eddy current free MR magnet 2. In particular, magnetic shield 4 is comprised of end plates 22 (FIG. 1), shell 6, circumferentially segmented cylindrical shell 30 and spacers 32. End plates 22, preferably, are constructed of iron or carbon steel and are bolted to shell 30 by conventional bolting techniques. Shell 6, provides support to shell 30 and is sealed by conventional sealing techniques against end plates 22 by vacuum tight, elastomeric O-ring seals 42 (FIG. 1). Shell 30, which, preferably, is constructed of iron or carbon steel, is broken up into many segments, for example, segments 30a, 30b. Segments 30a, 30b are bonded to shell 6 by conventional bonding techniques. Spacers 32 separate, for example, segments 30a and 30b from each other. Spacers 32, preferably, are constructed of any suitable fiber reinforced epoxy or air.

Located on gradient coils 16 are axial rails 24, drawers 26 and conventional passive shim packages 28. In particular, rails 24 are bonded by conventional bonding techniques to the inner surface of gradient coils 16 to provide support for drawers 26. Drawers 26, preferably, are constructed of fiberglass and are used to carry shim packages 28.

During operation, shells 8, 14 and end plates 15 and magnet cartridge 12 are thermally connected by conventional connectors to the first and second stages of a conventional Gifford-McMahon cryocooler, respectively. In this manner, shells 8, 14 and end plates 15 are substantially maintained at a temeprature of approximately 40 K. while magnet cartridge 12 is maintained at a temperature of approximately 10 K.

There are several advantages of the present invention over prior superconducting MR magnets. First, the present invention affords a dramatic reduction of the size, weight and cost of the magnet which provides the DC magnetic field for an MR imaging apparatus by integrating the magnet coils together with the gradient coils. Second, the reduction in size is achieved by virtue of the magnet coils being a much smaller diameter than those in a conventional magnet which would surround the gradient coil set. Finally, the reduction in diameter leads to a concomitant reduction in length, with the total reduction of superconductor volume being on the order of 60%.

Once given the above disclosure, many other features, modifications or improvements will become apparent to the skilled artisan. Such features, modifications or improvements are, therefore, considered to be a part of this invention, the scope of which is to be determined to by the following claims.

What is claimed is:

1. A superconducting magnet which is substantially eddy current free, said system comprising:
   a first shell means;
   a first shield means located at a predetermined distance away from said first shell means;
   a magnet cartridge means having a coil form means and superconducting coils wound on said coil form means and located substantially adjacent to said first shield means;
   a support means operatively connected between said magnet cartridge means and said shield means;
   at least one gradient coil means located at a predetermined distance away from said first shield means;
   a RF shield means operatively connected to said gradient coil means;
   a RF coil means located at a predetermined distance from said RF shield means; and
   an enclosure means which encloses said first shell means, said first shield means, said magnet cartridge means, said support means, said gradient coil means, and said RF shield means.

2. The magnet, according to claim 1, wherein said first shell means is further comprised of:
   a fiber glass material.

3. The magnet, according to claim 1, wherein said first shell means is rigidly attached to said enclosure means.

4. The magnet, according to claim 1, wherein said first shield means is further comprised of:
   a first outer shell means;
   a first inner shell means substantially located at a predetermined distance away from said first outer shell means; and
   a first end plate means operatively connected to said outer and inner shell means.

5. The magnet, according to claim 1, wherein said first shield means is constructed of fiberglass.

6. The magnet, according to claim 4, wherein said first outer shell means, said first inner shell means and said end plate means are further comprised of:
   a first axial strap means which is further comprised of overlapping straps bonded on said first outer shell means, said inner shell means and said end plate means and having an insulation means located at an overlapping interface between said overlapping straps.

7. The magnet, according to claim 1, wherein said coil form means is further comprised of:
   a second axial strap means which is further comprised of overlapping straps bonded to said magnet cartridge means and having an insulation means located at an overlapping interface between said overlapping straps.

8. The magnet, according to claim 1, wherein said support means is further comprised of:
   a third axial strap means located adjacent to said magnet cartridge means;
   a connection means located along said third axial strap means; and
   a tube means substantially located between said magnet cartridge means and said first shield means.

9. The magnet, according to claim 8, wherein said third axial strap means and said connection means support said coil means in said magnet.

10. The magnet, according to claim 8, wherein said tube means supports said first shield means on said magnet cartridge means.

11. The magnet, according to claim 1, wherein said RF shield means is operatively connected to said gradient coil means.

12. The magnet, according to claim 1, wherein said enclosure means is further comprised of:
    an axially segmented cylindrical shell means substantially located adjacent to said first shell means; and
    a spacer means substantially located adjacent to said axially segmented cylindrical shell means.

13. The magnet, according to claim 12, wherein said axially segmented cylindrical shell means is rigidly attached to said first shell means.

14. The magnet, according to claim 12, wherein said spacer means is further comprised of:
    Mylar film.

15. The system, according to claim 12, wherein said spacer means is further comprised of:
    ambient air.

16. The magnet, according to claim 1, wherein said gradient coil mean is further comprised of:
    an axial rail means rigidly attached to said gradient coil means;
    a drawer means supported by said rail means; and
    a passive shim package means substantially located within said drawer means.

* * * * *